(12) United States Patent
Wu et al.

(10) Patent No.: US 12,359,313 B2
(45) Date of Patent: Jul. 15, 2025

(54) DEPOSITION APPARATUS AND METHOD OF FORMING METAL OXIDE LAYER USING THE SAME

(71) Applicant: Taiwan Semiconductor Manufacturing Co., Ltd., Hsinchu (TW)

(72) Inventors: Ming-Fa Wu, Kaohsiung (TW); Wen-Lung Ho, Hsinchu County (TW); Jheng-Long Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 232 days.

(21) Appl. No.: 16/787,043

(22) Filed: Feb. 11, 2020

(65) Prior Publication Data

US 2021/0032750 A1 Feb. 4, 2021

Related U.S. Application Data

(60) Provisional application No. 62/880,666, filed on Jul. 31, 2019.

(51) Int. Cl.
*C23C 16/44* (2006.01)
*C23C 16/04* (2006.01)
(Continued)

(52) U.S. Cl.
CPC ........ *C23C 16/4404* (2013.01); *C23C 16/042* (2013.01); *C23C 16/403* (2013.01);
(Continued)

(58) Field of Classification Search
CPC . C23C 16/4404; C23C 16/042; C23C 16/403; C23C 16/4412; C23C 16/45544; C23C 16/45565; C23C 16/45574; C23C 16/45591; C23C 16/52; C23C 16/4408; C23C 16/45561; C23C 16/40; H01L 21/67011; H01L 21/823821;
(Continued)

(56) References Cited

U.S. PATENT DOCUMENTS 5,589,003 A * 12/1996 Zhao .................. C23C 16/4585
118/500
5,680,013 A * 10/1997 Dornfest .......... H01J 37/32495
315/111.21
(Continued)

FOREIGN PATENT DOCUMENTS

CN 207162296 U * 3/2018
CN 108893070 A * 11/2018 ................ C09J 7/21
(Continued)

*Primary Examiner* — Jeffrie R Lund
(74) *Attorney, Agent, or Firm* — JCIPRNET

(57) ABSTRACT

Provided is a deposition apparatus including a process chamber, a wafer platen and a shower head. The wafer platen is disposed in the process chamber. The shower head is located over the wafer platen and includes a shower plate and a hydrophobic film. The shower head has a plurality of dispensing holes for a reaction gas to pass through. The hydrophobic film is coated on a surface of the shower plate and surfaces of the plurality of dispensing holes. A method of forming a metal oxide layer using the deposition apparatus is further provided.

20 Claims, 13 Drawing Sheets

(51) Int. Cl.
*C23C 16/40* (2006.01)
*C23C 16/455* (2006.01)
*C23C 16/52* (2006.01)
*H01L 21/67* (2006.01)

(52) U.S. Cl.
CPC .... *C23C 16/4412* (2013.01); *C23C 16/45544* (2013.01); *C23C 16/45565* (2013.01); *C23C 16/45574* (2013.01); *C23C 16/45591* (2013.01); *C23C 16/52* (2013.01); *H01L 21/67011* (2013.01); *C23C 16/4408* (2013.01)

(58) Field of Classification Search
CPC ....... H01L 21/823842; H01L 21/02178; H01L 21/0228; H01L 21/32139; H01L 21/02104; H01L 21/67207
See application file for complete search history.

(56) References Cited

U.S. PATENT DOCUMENTS

| | | | | |
|---|---|---|---|---|
| 6,811,651 | B2* | 11/2004 | Long | C23C 16/452 |
| | | | | 118/712 |
| 6,837,966 | B2* | 1/2005 | Nishimoto | H01J 37/32834 |
| | | | | 204/298.07 |
| 7,300,537 | B2* | 11/2007 | O'Donnell | H01J 37/3255 |
| | | | | 118/724 |
| 7,552,521 | B2* | 6/2009 | Fink | H01J 37/32623 |
| | | | | 118/715 |
| 8,294,068 | B2* | 10/2012 | Ranish | F27B 17/0025 |
| | | | | 219/390 |
| 9,574,268 | B1* | 2/2017 | Dunn | C23C 16/45512 |
| 10,676,819 | B2* | 6/2020 | Sun | C23C 16/45553 |
| 11,164,726 | B2* | 11/2021 | Matsumoto | C23C 16/4404 |
| 11,414,757 | B2* | 8/2022 | Chen | C23C 16/52 |
| 11,866,821 | B2* | 1/2024 | Sheng | C23C 16/4581 |
| 2004/0061447 | A1* | 4/2004 | Saigusa | H01J 37/32009 |
| | | | | 315/156 |
| 2004/0063333 | A1* | 4/2004 | Saigusa | H01J 37/32431 |
| | | | | 438/758 |
| 2004/0211674 | A1* | 10/2004 | Tzeng | C25D 11/04 |
| | | | | 205/324 |
| 2006/0228496 | A1* | 10/2006 | Choi | H01J 37/3244 |
| | | | | 118/715 |
| 2008/0143785 | A1* | 6/2008 | Houjou | B41J 2/1643 |
| | | | | 347/45 |
| 2008/0248263 | A1* | 10/2008 | Kobrin | C23C 16/45514 |
| | | | | 427/255.28 |
| 2009/0061646 | A1* | 3/2009 | Chiang | C23C 16/45548 |
| | | | | 257/E21.24 |
| 2009/0165720 | A1* | 7/2009 | Kojima | H01L 21/67109 |
| | | | | 118/725 |
| 2011/0003482 | A1* | 1/2011 | Ogawa | H01L 21/31604 |
| | | | | 118/694 |
| 2011/0061812 | A1* | 3/2011 | Ganguly | H01L 21/68785 |
| | | | | 156/345.1 |
| 2011/0136346 | A1* | 6/2011 | Geissbuhler | H01J 37/32504 |
| | | | | 156/345.35 |
| 2013/0129577 | A1* | 5/2013 | Halpin | C23C 16/4409 |
| | | | | 422/236 |
| 2013/0273313 | A1* | 10/2013 | Sun | C23C 4/02 |
| | | | | 428/137 |
| 2014/0099797 | A1* | 4/2014 | Terasaki | H01L 21/02211 |
| | | | | 438/787 |
| 2014/0130743 | A1* | 5/2014 | Toriya | C23C 16/45574 |
| | | | | 118/725 |
| 2014/0231251 | A1* | 8/2014 | Hashiguchi | H01J 37/3244 |
| | | | | 427/535 |
| 2014/0235069 | A1* | 8/2014 | Breiling | C23C 16/45565 |
| | | | | 239/548 |
| 2016/0362782 | A1* | 12/2016 | Cheng | C23C 16/4408 |
| 2017/0011890 | A1* | 1/2017 | Aramaki | C23C 16/4586 |
| 2017/0204516 | A1* | 7/2017 | Nguyen | C23C 16/4404 |
| 2018/0076087 | A1* | 3/2018 | Yamauchi | C23C 16/18 |
| 2019/0145003 | A1* | 5/2019 | Chen | C23C 16/52 |
| | | | | 118/715 |
| 2019/0221432 | A1* | 7/2019 | Adachi | C23C 16/042 |
| 2019/0272981 | A1* | 9/2019 | Xu | H01J 37/3244 |
| 2019/0382890 | A1* | 12/2019 | Lerner | C23C 16/4485 |
| 2020/0312681 | A1* | 10/2020 | Tanaka | H01J 37/32366 |
| 2021/0032750 | A1* | 2/2021 | Wu | C23C 16/45565 |
| 2021/0115557 | A1* | 4/2021 | Ko | H01L 21/6719 |
| 2021/0262090 | A1* | 8/2021 | Cheng | C23C 16/45525 |
| 2022/0364234 | A1* | 11/2022 | Wu | H01L 21/0228 |

FOREIGN PATENT DOCUMENTS

| | | | | |
|---|---|---|---|---|
| JP | 2004098178 | A * | 4/2004 | ........ B41J 2/14314 |
| JP | 2012077147 | A * | 4/2012 | |
| JP | 2020147799 | A * | 9/2020 | |
| WO | WO-2016118915 | A1 * | 7/2016 | ........ B01L 3/502715 |
| WO | WO-2019139092 | A1 * | 7/2019 | ............ C01B 33/40 |

* cited by examiner

DEPOSITION APPARATUS AND METHOD OF FORMING METAL OXIDE LAYER USING THE SAME

CROSS-REFERENCE TO RELATED APPLICATION

This application claims the priority benefit of U.S. provisional application Ser. No. 62/880,666, filed on Jul. 31, 2019. The entirety of the above-mentioned patent application is hereby incorporated by reference herein and made a part of this specification.

BACKGROUND

In the fabrication of semiconductor integrated circuit (IC) devices, various device features such as insulation layers, metallization layers, passivation layers, etc., are formed on a semiconductor substrate. It is known that the quality of an IC device fabricated is a function of the processes in which these features are formed. The yield of an IC fabrication process, which in turn is a function of the quality of the device fabricated and a function of the cleanliness of the manufacturing environment in which the IC device is processed.

The ever increasing trend of miniaturization of semiconductor IC devices requires more stringent control of the cleanliness in the fabrication process and the process chamber in which the process is conducted. When a film is deposited on a wafer, materials are accumulated on the parts of the chamber, such as a shower plate or a valve, and the materials may fall on subsequent wafers. Therefore, attention has been drawn to how to avoid materials from accumulating on the parts of the process chamber.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
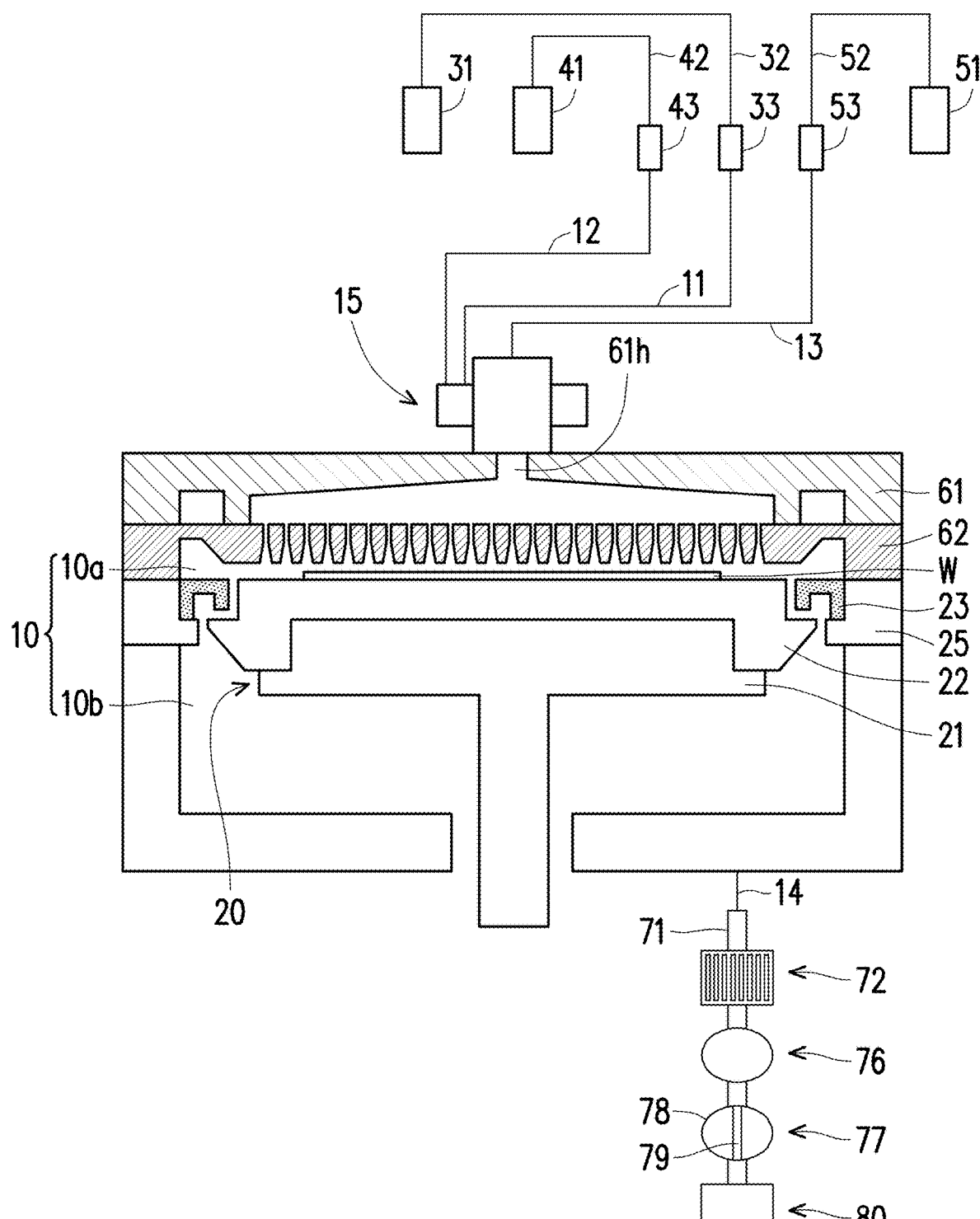
FIG. 1 is a schematic cross-sectional view of a deposition apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or step in addition to the orientation depicted in the figures. The apparatus may be otherwise oriented (rotated 90 degrees or at other orientations) and the spatially relative descriptors used herein may likewise be interpreted accordingly.

The present disclosure provides a deposition apparatus, in which a hydrophobic coating is applied on a part surface, so as to prevent water adsorption and film build-up on the part surface. With the deposition apparatus, chamber particles are significantly reduced and the chamber maintenance performance such as mean wafers between clean (MWBC) is accordingly improved.

FIG. 1 is a schematic cross-sectional view of a deposition apparatus in accordance with some embodiments.

Referring to FIG. 1, a deposition apparatus 1 may be used to deposit a metal oxide layer, such as an aluminum oxide ($Al_2O_3$) film, on a semiconductor wafer W. It is understood that the deposition apparatus 1 shown in FIG. 1 is merely one example of an atomic layer deposition (ALD) apparatus which is suitable for implementation of the present disclosure.

In some embodiments, the semiconductor wafer W is a semiconductor substrate including silicon. Alternatively or additionally, the semiconductor wafer W includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In some embodiments, the semiconductor wafer W includes a number of doped regions, conductive films and/or and insulation films.

In some embodiments, the deposition apparatus 1 includes a process chamber 10, a wafer platen 20, a gas supply unit 30 and a gas distribution unit 60.

The wafer platen 20 is disposed in the process chamber 10 to divide the process chamber into an upper process chamber 10a and a lower process chamber 10b. The wafer platen 20 is referred to a wafer chuck in some examples. The wafer platen 20 is configured to support the wafer W. In some embodiments, the wafer W has a target layer (e.g., metal layer) formed thereon. A heater 21 may be embedded in the wafer platen 20 for heating the wafer W supported on the wafer platen 20. In some embodiments, the heater 21 is heated to about 100-500° C., such as about 180° C. A heater cap 22 is disposed over the heater 21 and configured to support the wafer W and prevent a film from forming on the heater 21. In some embodiments, the heater cap 22 is heated to about 80-500° C., such as about 180° C.

A flow control ring 23 is disposed around the heater cap 22 and separated from the heater cap 22 by a distance, so as to prevent reaction gases from entering the lower process chamber 10b.

The gas supply unit 30 is configured to supply reaction gases into the process chamber 10. In some embodiments, the reaction gases include a first gas and a second gas. In some embodiments, the first gas includes water ($H_2O$), the second gas includes trimethyl aluminum (TMA). The wafer and TMA are used to form an aluminum oxide ($Al_2O_3$) layer over the target layer on the wafer W. In some embodiments, the aluminum layer serves as a mask layer for patterning the target layer on the wafer W.

The gas supply unit 30 includes a first gas source 31, a first gas line 32, and a first gas control element 33. The first gas source 31 is a reaction gas container and configured to store the first gas such as water. The first gas line 32 is in fluid communication with the first gas source 31 and the process chamber 10. In some embodiments, one end of the first gas line 32 is connected to the first gas source 31, and the other end of the first gas line 32 is connected to a first inlet 11 of the process chamber 10. In some embodiments, the first inlet 11 is located at the top of the process chamber 10. The first inlet 11 is in fluid communication with the first gas source 31 and the process chamber 10. The first inlet 11 faces the wafer platen 20, and is located above the center of the supporting surface of the wafer platen 20. The first gas control element 33 is installed on the first gas line 32. The first gas control element 33 is configured to control the flow rate of the first gas in the first gas line 32. In some embodiments, the first gas control element 33 is a valve or a pump.

The gas supply unit 30 further includes a second gas source 41, a second gas line 42, and a second gas control element 43. The second gas source 41 is a reaction gas container and configured to store the second gas such as TMA. The second gas line 42 is in fluid communication with the second gas source 41 and the process chamber 10. In some embodiments, one end of the second gas line 42 is connected to the second gas source 41, and the other end of the second gas line 42 is connected to a second inlet 12 of the process chamber 10. In some embodiments, the second inlet 12 is located at the top of the process chamber 10. The second inlet 12 is in fluid communication with the second gas source 41 and the process chamber 10. The second inlet 12 faces the wafer platen 20, and is located above the center of the supporting surface of the wafer platen 20. The second gas control element 43 is installed on the second gas line 42. The second gas control element 43 is configured to control the flow rate of the second gas in the second gas line 42. In some embodiments, the second gas control element 43 is a valve or a pump.

The gas supply unit 30 further includes a third gas source 51, a third gas line 52, and a second gas control element 53. The third gas source 51 is an inert gas container and configured to store the inert gas such as nitrogen. The third gas line 52 is in fluid communication with the third gas source 51 and the process chamber 10. In some embodiments, one end of the third gas line 52 is connected to the third gas source 51, and the other end of the third gas line 52 is connected to a third inlet 13 of the process chamber 10. In some embodiments, the third inlet 13 is located at the top of the process chamber 10. The third inlet 13 is in fluid communication with the third gas source 51 and the process chamber 10. The third inlet 13 faces the wafer platen 20, and is located above the center of the supporting surface of the wafer platen 20. The third gas control element 53 is installed on the third gas line 52. The third gas control element 53 is configured to control the flow rate of the third gas in the third gas line 52. In some embodiments, the third gas control element 53 is a valve or a pump.

A pulse valve manifold (PVM) 15 is disposed between the process chamber 10 and each of the first inlet 11, the second inlet 12 and the third inlet 13. The process feed is supplied to the process chamber 10 via the pulse valve manifold 15. The pulse valve manifold 15 delivers the process feed, including reaction gases and/or inert gases, to the process chamber 10 via suitable valves and distribution pluming that manage the flow of the process feed during various substrate processing and/or module maintenance operations.

In some embodiments, when the reaction gas (e.g., TMA or $H_2O$) flows into the upper process chamber 10a, the insert gas (e.g., $N_2$) flows into the lower process chamber 10b to provide a micro-positive pressure and therefore prevent the reaction gas (e.g., TMA or $H_2O$) from flowing into the lower chamber 10b.

The gas distribution unit 60 is disposed in the process chamber 10, and configured to distribute the reaction gases in the process chamber 10. In some embodiments, the gas distribution unit 60 is located at the top of the process chamber 10. The gas distribution unit 60 faces the wafer platen 20.

In some embodiments, the gas distribution unit 60 includes a gas channel plate 61 and a shower head 62. In some embodiments, each of the gas channel plate 61 and the shower head 62 includes aluminum, aluminum alloy (e.g., 5083 or 6063 aluminum alloy), stainless steel (e.g., stainless steel 304 or 316), hastelloy (e.g., hastelloy C22) or titanium.

The gas channel plate 61 is located over the wafer platen 20. In some embodiments, the gas channel plate 61 is heated to about 120-300° C., such as about 180° C. In some embodiments, the temperature of the gas channel plate 61 can be, for example but is not limited to, about 120° C., 130° C., 140° C., 150° C., 160° C., 170° C., 180° C., 190° C., 200° C., 210° C., 220° C., 230° C., 240° C., 250° C., 260° C., 270° C., 280° C., 290° C., 300° C., including any range between any two of the preceding values.

The gas channel plate 61 includes at least one dispensing hole 61h for the reaction gas to pass through. The gas channel plate 61 has a dome-like shape with an inclined sidewall extending downwardly from the dispensing hole 61h toward the sidewall of the process chamber 10, so as to allow the reaction gas to uniformly flow toward the shower head 62.

The shower head 62 is located over the wafer platen 20 and between the gas channel plate 61 and the water platen 20. In some embodiments, the shower head 62 is heated to about 80-400° C., such as about 180° C. In some embodiments, the temperature of the shower head 62 can be, for example but is not limited to, about 80° C., 100° C., 120° C., 140° C., 160° C., 180° C., 200° C., 220° C., 240° C., 260° C., 280° C., 300° C., 320° C., 340° C., 360° C., 380° C., 400° C., including any range between any two of the preceding values. In some embodiments, a shielding element 25 is located under the shower head 62. In some embodiments, the flow control ring 23 is disposed on and in direct contact with the shielding element 25.

Figure 2:
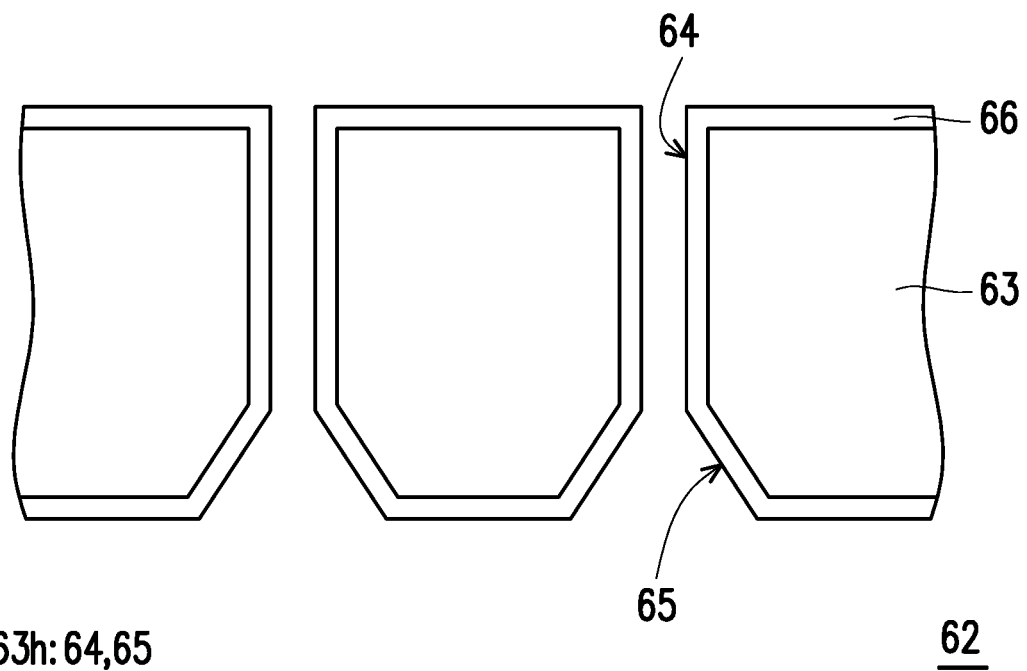
FIG. 2 is a partial enlarged view of a shower head of the deposition apparatus in FIG. 1.

In some embodiments, the shower head 62 includes a shower plate 63 and a hydrophobic film 66, as shown in FIG. 2. The shower plate 63 is provided with a plurality of dispensing holes 63h for the reaction gas to pass through. In some embodiments, the dispensing holes 63h are arranged in an array. With the dispensing holes 63h, the reaction gas uniformly flows toward the semiconductor wafer W or the wafer platen 20. In some embodiments, the hydrophobic film 66 has a thickness of about 0.01-100 um, such as 20 um.

In some embodiments (not shown), multiple shower heads 62 may be provided to improve the uniformity of the reaction gases. For example, the upper dispensing holes 63h of the upper shower head 62 and the lower dispensing holes 63h of the lower shower head 62 are arranged in a staggered manner. The diameter of the upper dispensing holes 63h may be different from (e.g., greater than) the diameter of the lower dispensing holes 63h. The reaction gas flows uniformly through the upper dispensing holes 63h toward the lower dispensing holes 63h. Therefore, the uniformity of the reaction gas flowing toward the semiconductor wafer W or the wafer platen 20 is improved by the upper and lower dispensing holes 63h.

In some embodiments, the hydrophobic film 66 is coated on the surface of the shower plate 63 and surfaces of the plurality of dispensing holes 63h, as shown in FIG. 2. In some embodiments, each of the dispensing holes 63h has a horn shape. For example, each of the dispensing holes 63h includes an upper hole 64 close to the gas channel plate 61 and a lower hole 65 away from the gas channel plate 61. In some embodiments, the upper hole 64 has a straight sidewall, and the lower hole 65 has an inclined sidewall. Specifically, each of the dispensing holes 63h has a straight hole and a cone hole connected to one another.

Figure 3:
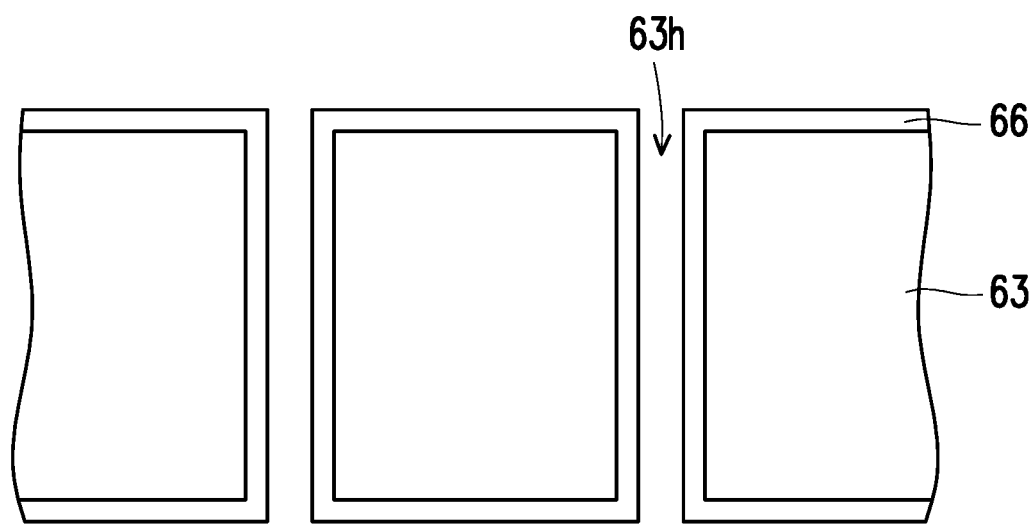
FIG. 3 to FIG. 7 are partial enlarged views of various shower heads in accordance with some embodiments.
Figure 4:
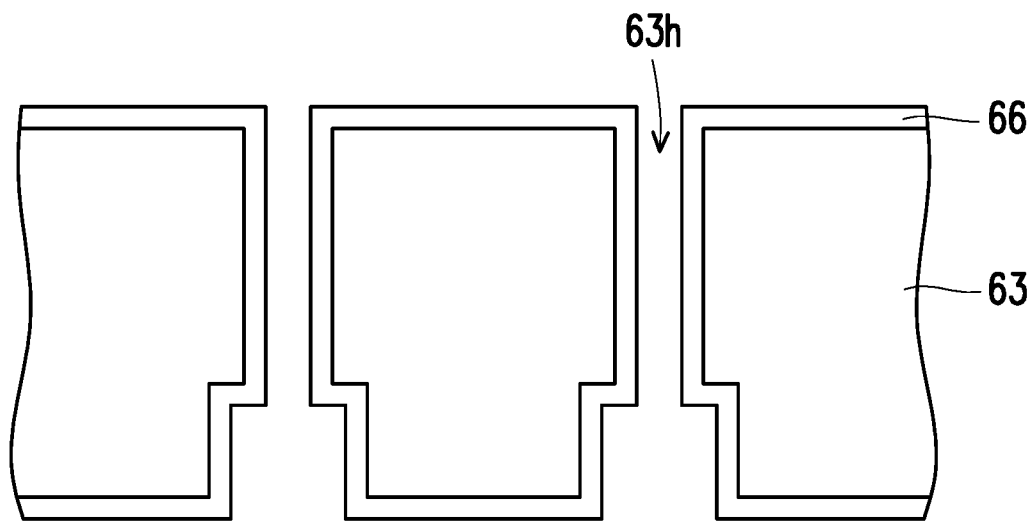

The shapes of the dispensing holes 63h are not limited by the disclosure. Each of the dispensing holes 63h may have a shape other than the described horn shape. In some embodiments, each of the dispensing holes 63h is a straight hole with a vertical sidewall, as shown in FIG. 3. Specifically, each of the dispensing holes 63h has a constant diameter from top to bottom. In alternative embodiments, each of the dispensing holes 63h is a straight hole with a stepped sidewall, as shown in FIG. 4. Specifically, each of the dispensing holes 63h has two different diameters, an upper hole 64 close to the gas channel plate 61 has a smaller dimension, and a lower hole 65 away from the gas channel plate 61 has a greater dimension.

Besides, the dimensions and/or shapes of the dispensing holes 63h of the same shower head 62 may be varied, so as to uniformly distribute the reaction gases to the wafer W. For example, the dispensing holes 63h at the center may have a shape and/or dimension different from the dispensing holes 63h at the edge of the shower head 62.

In some embodiments, the hydrophobic film 66 has a surface energy less than about 70 mN/m. In some embodiments, the surface energy of the hydrophobic film 66 can be, for example but is not limited to, about 70 mN/m, 65 mN/m, 60 mN/m, 55 mN/m, 50 mN/m, 45 mN/m, 40 mN/m, 35 mN/m, 30 mN/m, 25 mN/m, 20 mN/m, 15 mN/m, including any range between any two of the preceding values and any range less than any one of the preceding values. In some embodiments, the surface energy of the hydrophobic film 66 is such as to provide a hydrophobic surface with a contact angle greater than 90 degrees and less than 180 degrees, such as from about 100 degrees to about 165 degrees.

In some embodiments, the hydrophobic film 66 includes a polymer material or an insulating material. For example, the hydrophobic film 66 includes polytetrafluoroethylene (PTFE) (e.g., Teflon), silicone, poly(vinylidene fluoride), polyethylene (PE), polypropylene (PP), polystyrene, poly (vinyl chloride) (PVC), nylon (e.g., nylon-6,6), poly(ethylene terephthalate) (PET) or hydrophobic $SiO_2$.

In some embodiments, a Teflon-coated part can prevent —OH bonding on the Teflon surface due to fluorine passivated carbon chain. In some embodiments, the shower head 62 (e.g., 5083 or 6063 aluminum alloy) has a hydrophobic surface by being coated with PTFE, and the thickness of PTFE is from about 1 um to about 2,000 um, such as about 20 um.

In alternative embodiments, the hydrophobic film 66 includes a metal or a metal oxide. For example, the hydrophobic film 66 includes hydrophobic nickel or LaO. In some embodiments, the oxides of the lanthanide series (e.g., LaO) are hydrophobic due to their electronic structure. Specifically, owing to the unfilled inner 4 f orbitals of the metal atoms that are shielded from interactions with the surrounding environment by a full octet outer shell $5s^2p^6$, rare earth oxides have a lower tendency to form hydrogen bonds with water molecules, resulting in hydrophobicity. In some embodiments, nickel is hydrophobic when it has a nano-micro-cone array structure with a water contact angle of about 155 degrees.

In some embodiments, the hydrophobic film 66 is formed by electrostatic coating a low surface energy material, such as Teflon. In alternative embodiments, the hydrophobic film 66 is formed by electro-depositing a super-hydrophobic material, such as textured Ni. In yet alternative embodiments, the hydrophobic film 66 is formed by performing a thermal chemical reaction and followed by a He/Ar treatment, so as to form a hydrophobic material, such as hydrophobic $SiO_2$.

In the above embodiments, the shower head 62 and the hydrophobic film 66 are formed with substantially smooth surfaces, but the disclosure is not limited thereto. In some embodiments, at least one of the shower head 62 and the hydrophobic film 66 may be modified to have a rough or micro-nanostructure as needed. Such rough or micro-nanostructure is capable of providing a hydrophobic surface. Such part is hydrophobic due to its hierarchical roughness or micro-nanostructure on the surface thereof.

In some embodiments, during an ALD process of forming an aluminum oxide film, two precursors (e.g., TMA and $H_2O$) flow alternately into the process chamber by a carrying gas (e.g., nitrogen). The precursor pulse time is about 0.05-5 seconds, and the nitrogen purge time is about 0.1-5 seconds. In some embodiments, the flow rate of the reaction gas (e.g., TMA or $H_2O$) is in a range from about 100 sccm to about 2,000 sccm.

The hydrophobic surface of the disclosure can prevent water adsorption and film build-up on the part surface. The hydrophobic surface of the disclosure can reduce the $H_2O$ purge away time in the recipe and therefore improve the recipe throughput. Specifically, $H_2O$ vapor is not easily absorbed on the surface of a chamber part and easy to purge away by N2 in a cyclic purge operation. It will minimize the mixture and reaction of TMA and $H_2O$ on the part surface.

Figure 5:
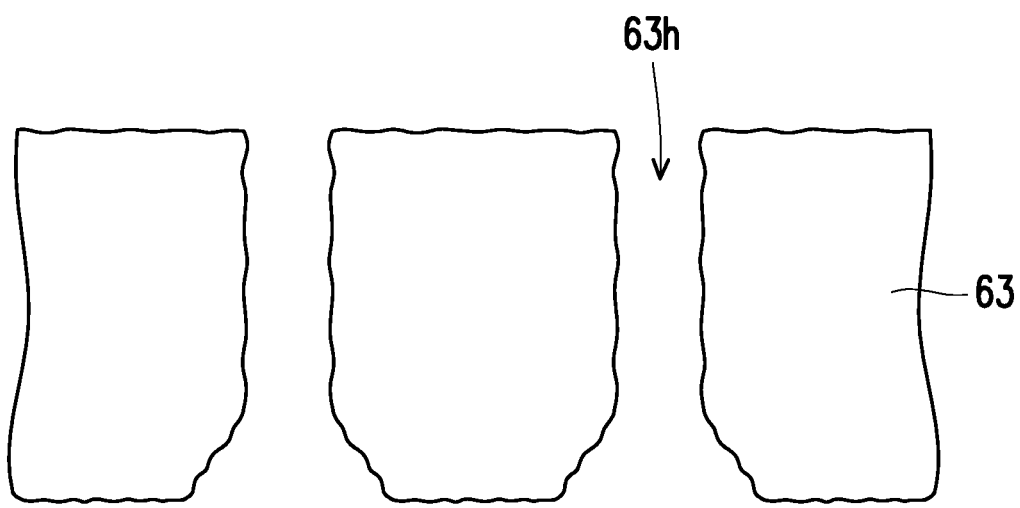

In some embodiments, the hydrophobic film 66 may be omitted, and the shower head 62 is provided with a rough surface or having a micro-nanostructure, so as to provide a hydrophobic surface, as shown in FIG. 5. In some embodiments, a chemical etching process is applied to remove a layer on a metal surface through chemical reaction and therefore obtain a micro-nanostructure surface. In some embodiments, 6063 aluminum alloy is chemically etched, so as to roughen the surface of the shower plate 63 and the surfaces of the dispensing holes 63h. Specifically, 6063 aluminum alloy is chemically etched using 1M alkaline NaOH solution (pH of 14) in an ultrasonic bath. After cleaning with DI water, the etched aluminum alloy is dried at 70° C. oven. The passivation process is performed by immersing the etched aluminum alloy at room temperature in 0.01M ethanolic stearic acid (SA) solution. The micro-nanostructure feature appeared on the etched surface after SA passivation for 5 seconds has a contact angle of about 145 degrees.

In some embodiments, an electro-deposition is applied on the chamber part to provide a super-hydrophobic surface. In some embodiments, an electro-deposition is setup with an anode and a cathode (usually the metal part to be coated) immersed in an electrolyte containing metal ions, such as in aqueous, organic or ionic liquid solutions.

In some embodiments, Ni electro-deposition in bath (constituents: $NiCl_2$, $H_3BO_3$, ethylenediamine, dihydrochloride) is performed to achieve a nano-micro-cone array structure with a water contact angle of about 155 degrees.

Figure 6:
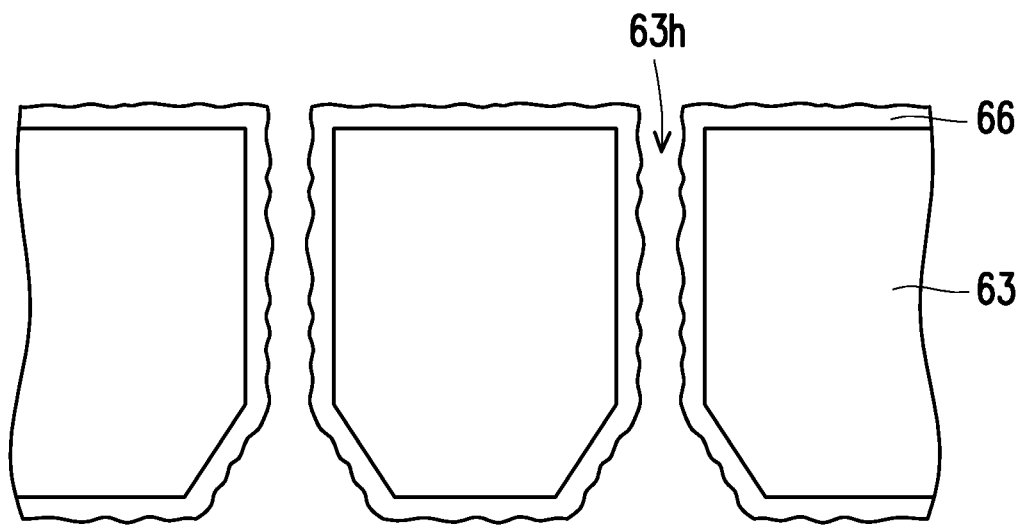

In some embodiments, the shower head 62 is formed with a substantially smooth surface, while the hydrophobic film 66 is formed with a rough surface or having a micro-nanostructure, so as to provide a hydrophobic surface, as shown in FIG. 6. In some embodiments, an array of Ni micro-nano cones is fabricated with an electro-deposition method, so as to provide a super-hydrophobic surface. In some embodiments, the rough surface of the hydrophobic film 66 is modified by a low surface energy material, such as PTFE.

Figure 7:
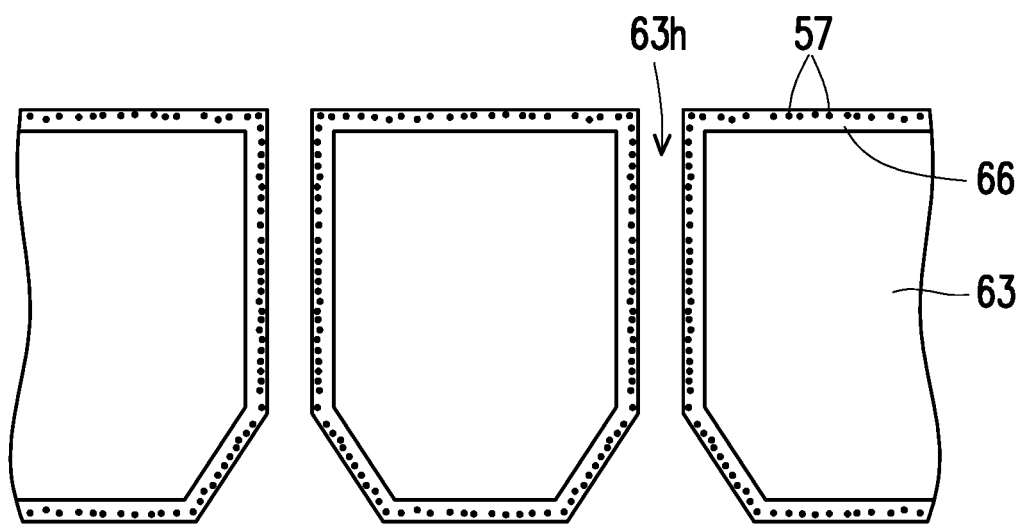

In some embodiments, the hydrophobic film 66 includes hydrophobic particles 57 therein, as shown in FIG. 7. For example, the hydrophobic particles 57 include metal matrix composite hydrophobic particles, such as Ni-PTFE composites coating, or Ni-oxides of the lanthanide series co-deposition. Specifically, the hydrophobic surface on the part is made by composite electro-deposition with co-deposited inert and hydrophobic particles, for example, Ni-PTFE composite.

In view of the above, the hydrophobicity of the shower head 62 is achieved by at least one of the following means: (1) surface roughness alone; (2) surface roughness and surface chemical modification with low surface energy material; and (3) co-deposition of hydrophobic particle with a metal matrix.

The above embodiments in which the shower head is modified to provide hydrophobicity and therefore prevent water adsorption and film build-up on the part surface are provided for illustration purposes, and are not construed as limiting the disclosure. In some embodiments, another metal part of the deposition apparatus may be modified in the same manner to provide hydrophobicity. For example, the metal part includes a valve (e.g., isolation valve manifold), a ring (e.g., flow control ring), a tube, a pipe, a line (e.g., gas line or pumping line), a manifold (e.g., pulse valve manifold), a plate (e.g., gas channel plate), a cap (e.g., heater cap), a heater or a combination thereof. The tube, pipe and line may be coated with a hydrophobic film in the inner surface, outer surface or both.

Turning to FIG. 1, in some embodiments, the deposition apparatus 1 further includes an exhaust unit 70. The exhaust unit 70 is in fluid communication with the process chamber 10. The exhaust unit 70 is configured to remove the excess reaction gases and/or by-products from the process chamber 10.

In some embodiments, the exhaust unit 70 includes a pumping line 71, an isolation valve 76, a throttle valve 77, and a vacuum pump 80. The pumping line 71 is in fluid communication with the process chamber 10 and the vacuum pump 80. In some embodiments, the diameter of pumping line may range from about 50 mm to 300 m, such as about 100 mm. In some embodiments, the process chamber 10 includes an outlet 14 located at a side of the process chamber 10. One end of the pumping line 71 is connected to the outlet 14, and the other end of the pumping line 71 is connected to the vacuum pump 80.

The isolation valve 76 and the throttle valve 77 are installed on the pumping line 71. The isolation valve 76 is in fluid communication with the process chamber 10, and the throttle valve 77 is installed downstream from the isolation valve 76. The throttle valve 77 is configured to control a gas flow rate in the pumping line 71.

During a deposition process, the isolation valve 76 remains open while the throttle valve 77 cycles between the open and closed positions to regulate the gas pressure in the process chamber 10.

In some embodiments, the throttle valve 77 includes a housing 78 and a throttle plate 79. The housing 78 is connected to the pumping line 71. The throttle plate 79 is pivoted in the housing 78. The flow rate in the pumping line 71 can be adjusted via the rotation of the throttle plate 79. When the throttle plate 79 is in the blocking position, the gas in the process chamber 10 is blocked from being exhausted from the process chamber 10. When the throttle plate 79 is in the exhaust position as shown in FIG. 1, the excess reaction gases and/or by-products in the process chamber 10 is exhausted from the process chamber 10. Specifically, when the deposition apparatus 1 starts a semiconductor manufacturing process, such as an ALD process, the throttle plate 79 is rotated to the exhaust position, and the vacuum pump 80 starts to vacuum the process chamber 10.

The vacuum pump 80 is installed on the pumping line 71. The vacuum pump 80 is configured to vacuum the process chamber 10. The excess reaction gases and/or by-products in the process chamber 10 is drawn by the vacuum pump 80.

In some embodiments, the exhaust unit 70 further includes a trap element 72 configured to trap water from the process chamber 10. For example, the trap element 72 is installed to deplete non-reacted gases (e.g., TMA and $H_2O$) to prevent vacuum pump seizure. In some embodiments, the trap element 72 is disposed between the process chamber 10 and the isolation valve 76, as shown in FIG. 1. However, the location of the trap element 72 is not limited by the disclosure. In alternative embodiments, the trap element 72 may be disposed between the throttle valve 77 and the vacuum pump 80.

Figure 8:
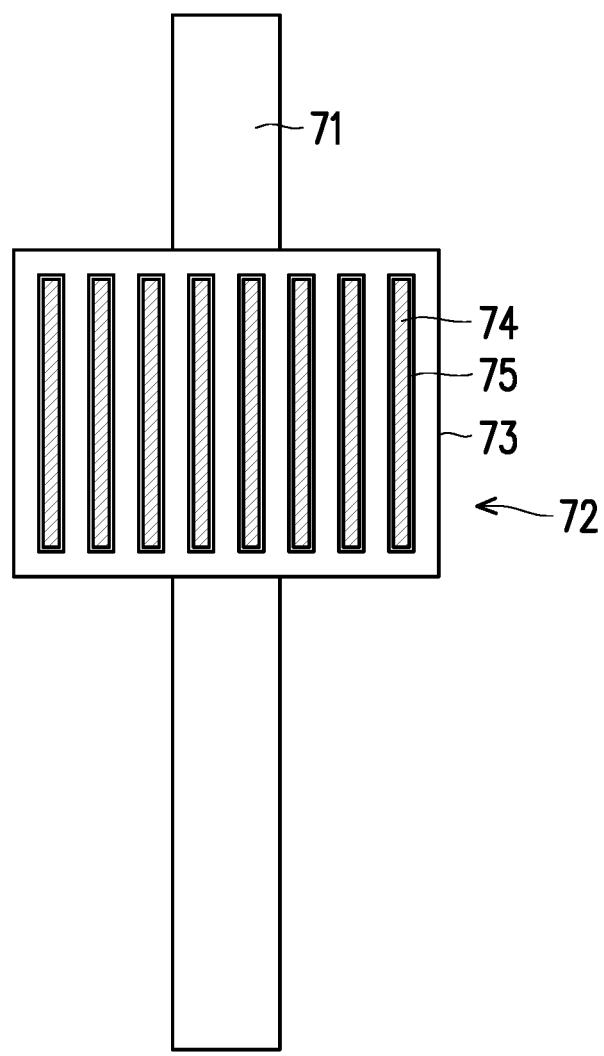
FIG. 8 is an enlarged view of a trap element in accordance with some embodiments.

The trap element 72 is installed on the pumping line 71. In some embodiments, the trap element 72 includes a housing 73 and a plurality of metal sheets 74 each coated with a hydrophobic film 75, as shown in FIG. 8.

Figure 9:
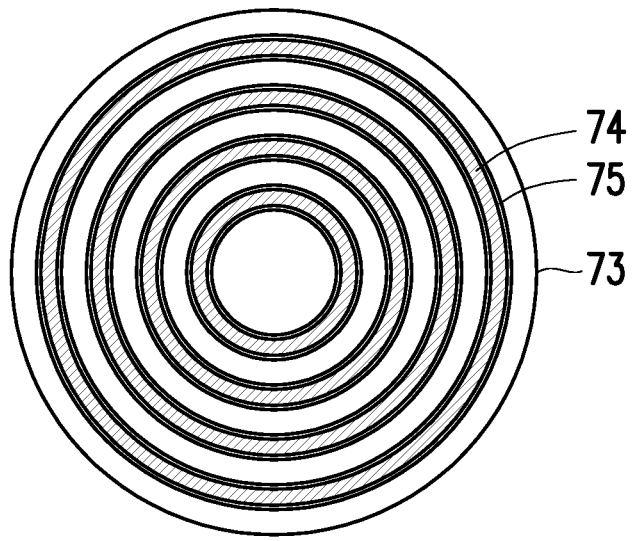
FIG. 9 to FIG. 10 are schematic top views of various trap elements in accordance with some embodiments.
Figure 10:
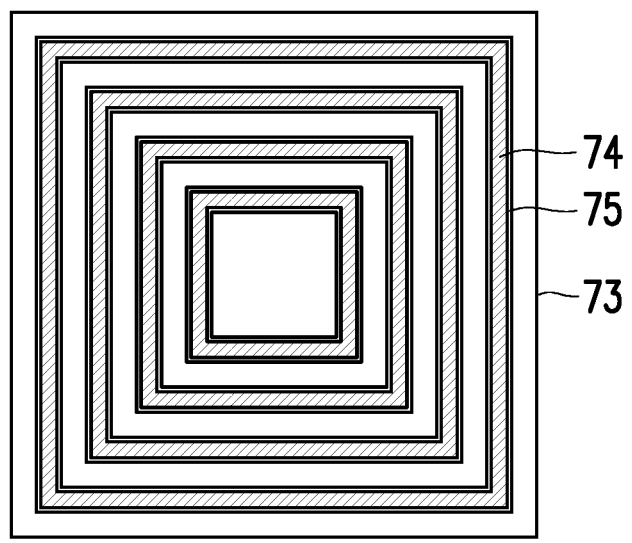

In some embodiments, the metal sheets 74 are formed as circular ring shaped sheets, as shown in FIG. 9. In alternative embodiments, the metal sheets 74 are formed as rectangular ring shaped sheets, as shown in FIG. 10. The shapes of the metal sheets 74 are not limited by the present disclosure. In some embodiments, the metal sheets 74 are formed as strip shaped sheets, or connected to form a net-like structure. In some embodiments, the thickness of the metal sheets may range from about 0.1 mm to about 10 mm, such as about 0.5 mm. The gap of the metal sheets may range from about 0.1 mm to about 20 mm, such has about 5 mm.

In some embodiments, the trap element 72 is heated at a temperature ranging from about 20° C. to about 300° C., such as about 100° C. In alternative embodiments, the trap element 72 is heated at a temperature ranging from about 80° C. to about 250° C., such as about 130° C. In some embodiments, the temperature of the trap element 72 can be, for example but is not limited to, about 20° C., 30° C., 40°

C., 50° C., 60° C., 70° C., 80° C., 90° C., 100° C., 110° C., 120° C., 130° C., 140° C., 150° C., 160° C., 170° C., 180° C., 190° C., 200° C., 210° C., 220° C., 230° C., 240° C., 250° C., 260° C., 270° C., 280° C., 290° C., 300° C., including any range between any two of the preceding values.

The reaction gases (e.g., TMA and $H_2O$) may be thermally reacted on the metal sheet surface. The hydrophobic film 75 is configured to prevent water adsorption and film build-up on the metal sheet surface.

In some embodiments, the material and forming method of the hydrophobic film 75 are similar to those of the hydrophobic film 66 described above. In some embodiments, the hydrophobic film 75 has a surface energy less than about 70 mN/m. In some embodiments, the hydrophobic film includes polytetrafluoroethylene (PTFE), silicone, poly(vinylidene fluoride), polyethylene (PE), polypropylene (PP), polystyrene, poly(vinyl chloride) (PVC), nylon, poly (ethylene terephthalate) (PET), hydrophobic $SiO_2$, hydrophobic nickel or LaO. In some embodiments, the hydrophobic film 75 includes hydrophobic particles therein. The hydrophobic particles in the trap element 72 are similar to hydrophobic particles 57 in the shower head 62, so the details are not iterated herein. In some embodiments, at least one of the metal sheets 74 and the hydrophobic films 76 is provided with a rough surface or having a micro-nanostructure.

The above embodiments in which the deposition apparatus 1 is a single-chamber ALD apparatus are provided for illustration purposes, and are construed as limiting the present disclosure. In some embodiments, the deposition apparatus 2 is a dual-chamber ALD apparatus, as shown in FIG. 11.

Figure 11:
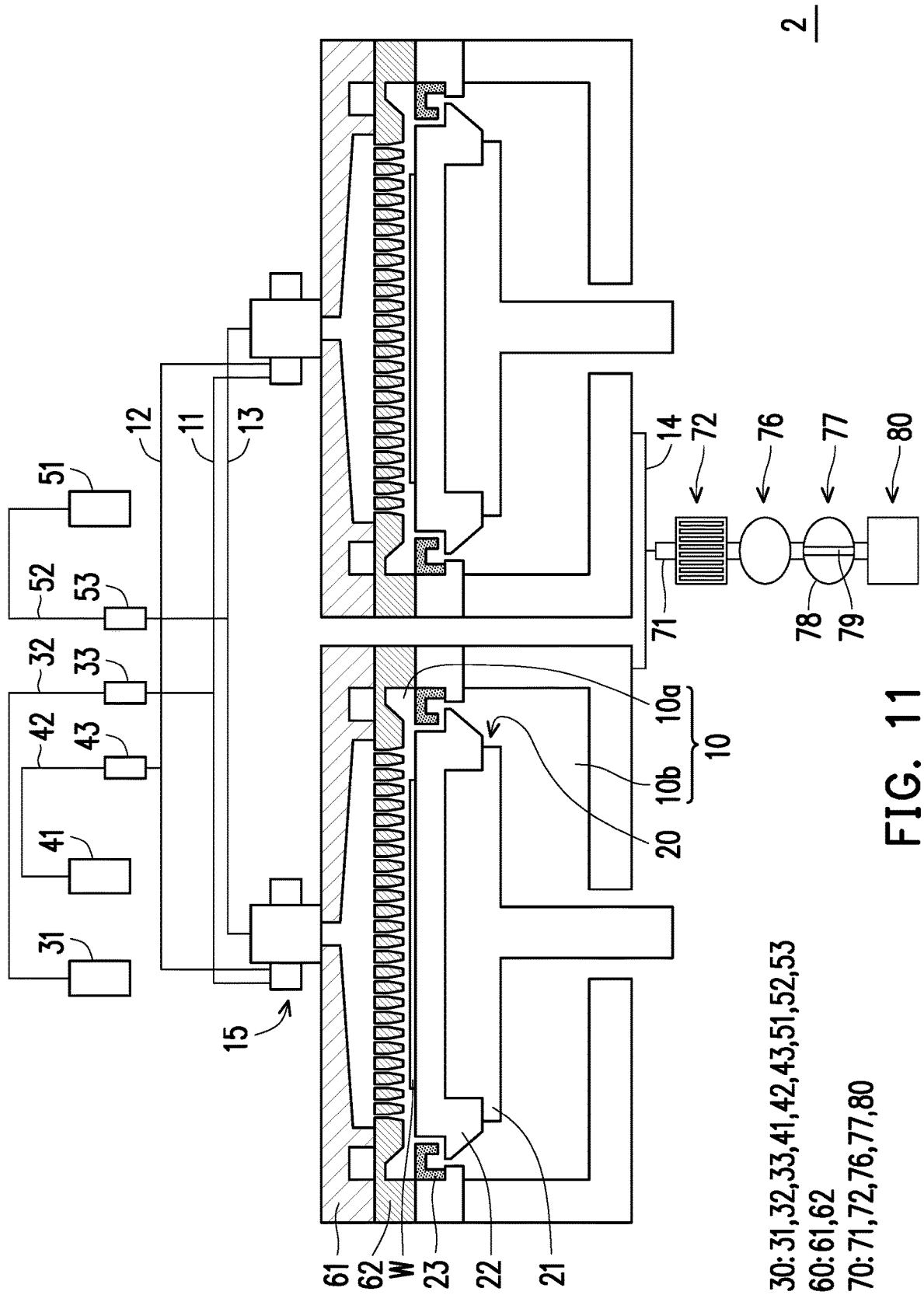
FIG. 11 is a schematic cross-sectional view of a deposition apparatus in accordance with alternative embodiments.

Referring to FIG. 11, two process chambers 10 are arranged side-by-side. Each of the process chambers 10 is provided with a wafer platen 20 and a gas distribution unit 60, and the two process chambers 10 share the gas supply unit 30 and the exhaust unit 70.

In the above embodiments, the deposition apparatus 1 is an ALD apparatus for depositing a metal oxide layer such as an aluminum oxide ($Al_2O_3$) film, but the disclosure is not limited thereto. In some embodiments, the deposition apparatus 1 may be an ALD apparatus for depositing ZrO, HfO or a compound using water as a precursor.

In the following embodiments, the metal oxide layer (such as an aluminum oxide film) serves as a mask layer, but the disclosure is not limited thereto. In some embodiments, the metal oxide layer may serve as an etching stop layer or an insulating layer during a semiconductor process.

Figure 12A:
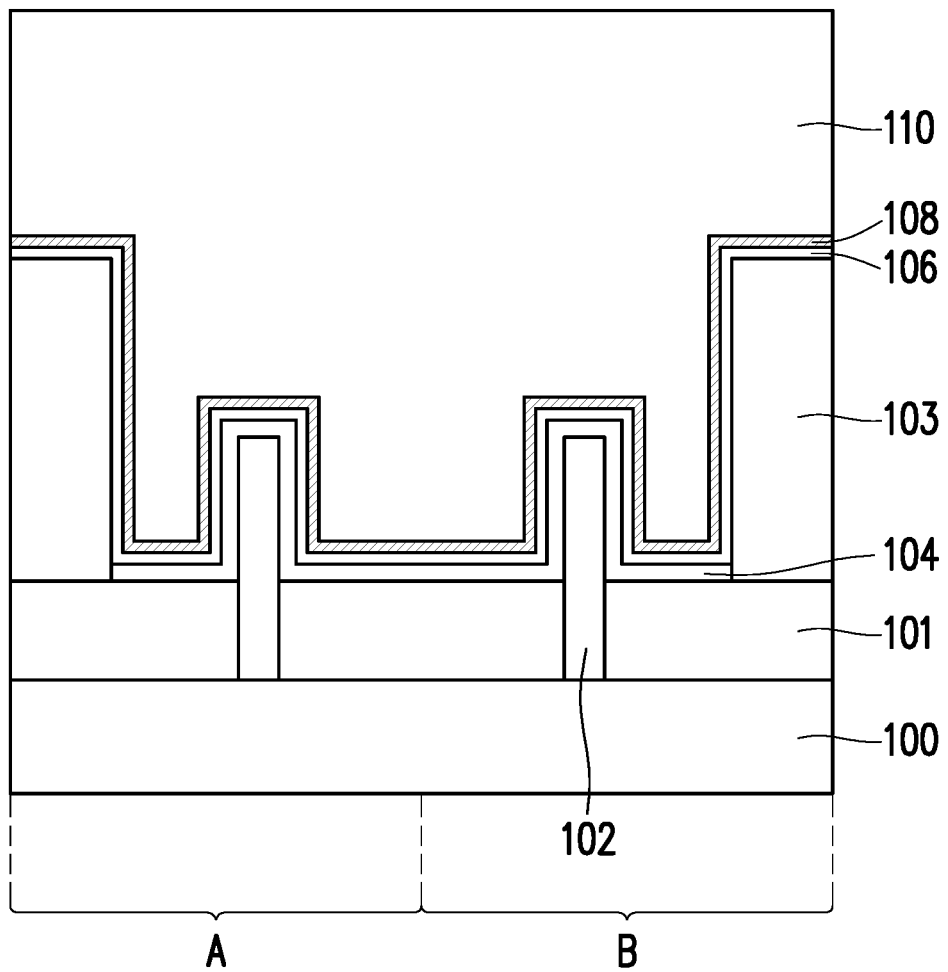
FIG. 12A to FIG. 12B are schematic cross-sectional views of a method of forming a metal oxide layer in accordance with some embodiments.
Figure 12B:
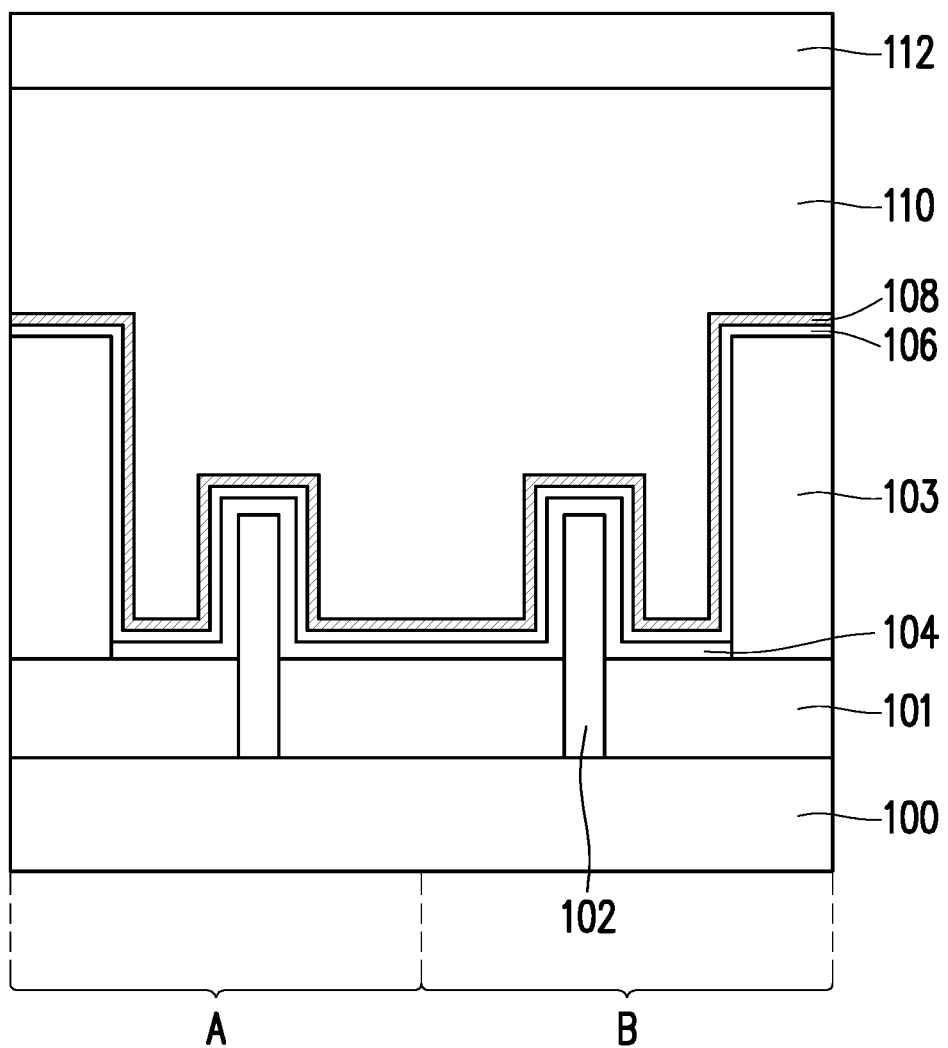

FIG. 12A to FIG. 12B are schematic cross-sectional views of a method of forming a metal oxide layer in accordance with some embodiments.

Referring to FIG. 12A, a substrate 100 is provided. In some embodiments, the substrate 100 has a region A and a region B. In some embodiments, the region A is an N-type device region, and the region B is a P-type device region. The substrate 100 has fins 102 protruded from the substrate 100, an isolation layer 101 covering the lower portions of the fins 102, an inter-layer dielectric layer 103 formed over the substrate 100 and having an opening that exposes the fins 102, an interfacial layer 104 formed on the surfaces of the fins 102, a high-k layer 106 formed over the interfacial layer 104 and the surface of the inter-layer dielectric layer 103, a metal layer 108 formed over the high-k layer 106, and a bottom layer 110 filling the opening of the inter-layer dielectric layer 103. In some embodiments, the metal layer 108 is a target layer. In some embodiments, the metal layer 108 is a titanium nitride (TiN) layer.

Referring to FIG. 12B, a metal oxide layer 112 is formed over the bottom layer 112. In some embodiments, the metal oxide layer 112 is a mask layer for an etching process. In some embodiments, the metal oxide layer 112 is an aluminum oxide ($Al_2O_3$) film. In some embodiments, the substrate 100 is provided in a process chamber of an ALD apparatus (e.g., the deposition apparatus 1 of FIG. 1), wherein the substrate 100 has a target layer (e.g., metal layer 108) formed thereon. Specifically, a first gas and a second gas are introduced into the process chamber 10 through a shower head 62 of the deposition apparatus 1, so as to form a metal oxide layer 112 (e.g., an aluminum oxide film) on the target layer (e.g., metal layer 110), wherein the first gas includes water ($H_2O$), the second gas includes trimethyl aluminum (TMA), and the shower head 62 is coated with a hydrophobic film 66.

FIG. 12C to FIG. 12F are schematic cross-sectional views of a patterning method by using a metal oxide layer as a mask in accordance with some embodiments.

Figure 12C:
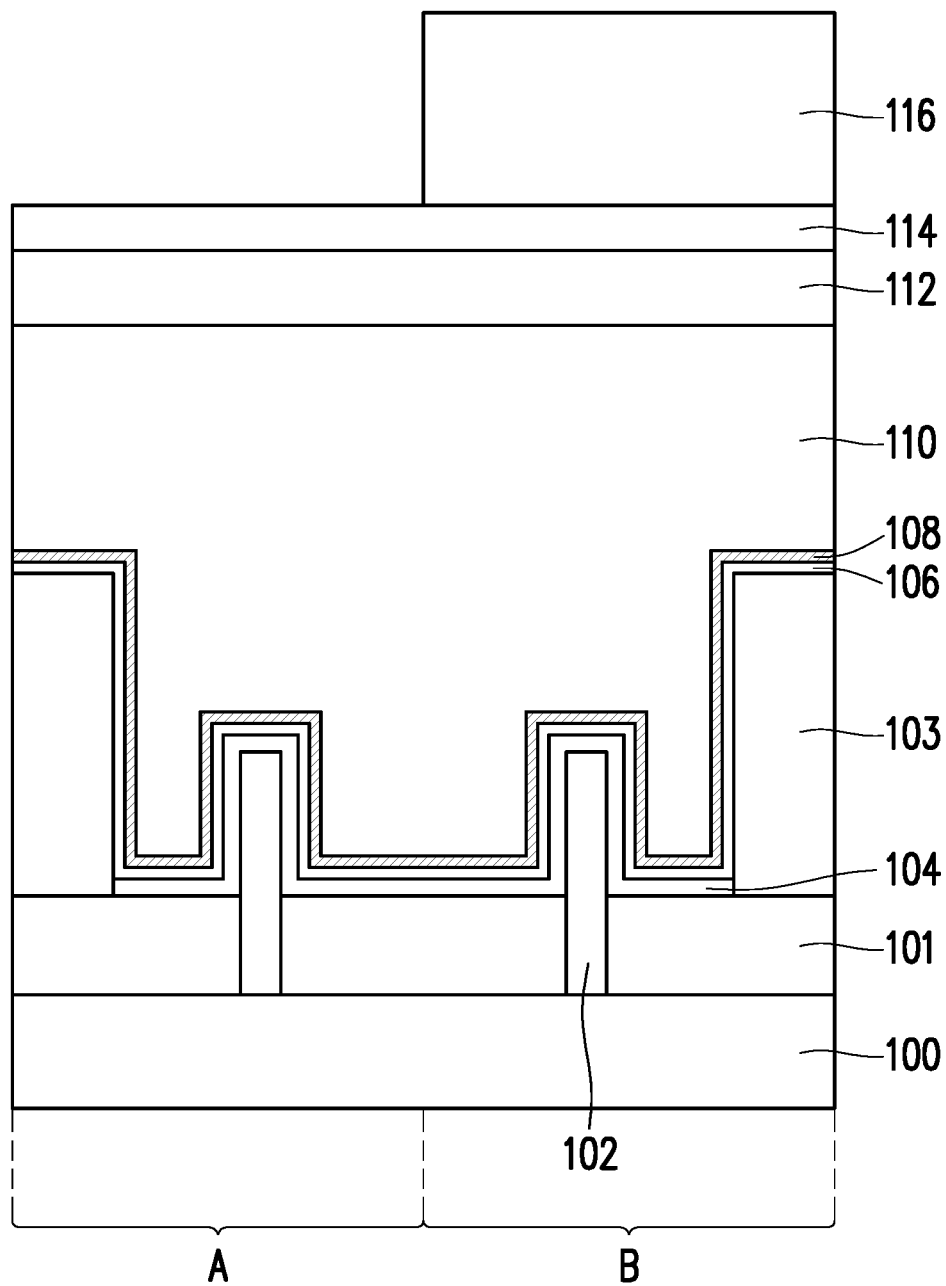
FIG. 12C to FIG. 12F are schematic cross-sectional views of a patterning method by using a metal oxide layer as a mask in accordance with some embodiments.

Referring to FIG. 12C, a bottom anti-reflection coating (BARC) layer 114 is formed on the metal oxide layer 112. Thereafter, a patterned photoresist layer 116 is formed on the BARC layer 114. In some embodiments, the patterned photoresist layer 116 covers the BARC layer 114 in the region B and exposes the BARC layer 114 in the region A.

Figure 12D:
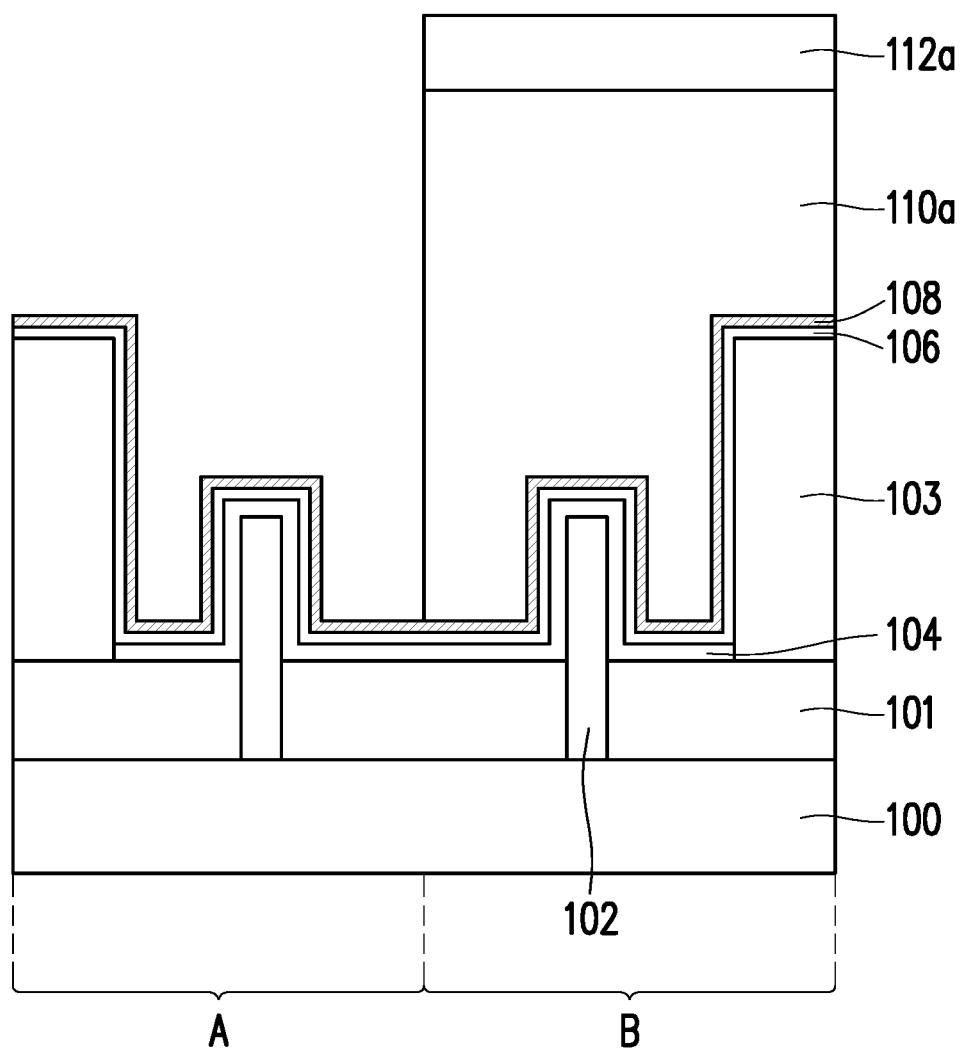

Referring to FIG. 12D, the BARC layer 114 and the metal oxide layer 112 are sequentially patterned by using the patterned photoresist layer 116 as a mask. The patterned photoresist layer 116 and the underlying BARC layer 114 are removed. The patterned metal oxide layer 112a covers the bottom layer 110 in the region B and exposes the bottom layer 110 in the region A. The bottom layer 110 is removed by using patterned metal oxide layer 112a as a mask. The patterned bottom layer 110a covers the metal layer 108 in the region B and exposes the metal layer 108 in the region A.

Figure 12E:
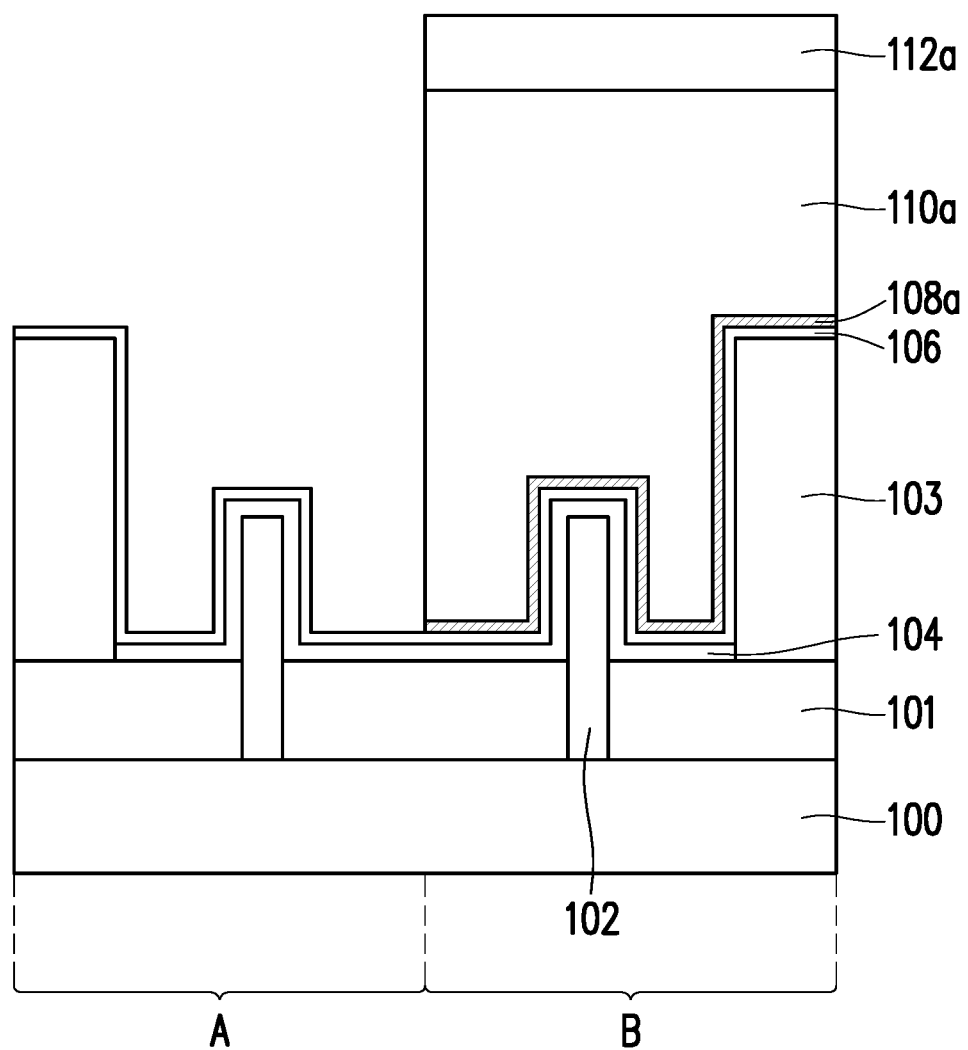

Referring to FIG. 12E, the metal layer 108 as a target layer is patterned by using the patterned metal oxide layer 112a and the patterned bottom layer 110a as a mask. The patterned metal layer 108a covers the high-k layer 106 in the region B and exposes the high-k layer 106 in the region A.

Figure 12F:
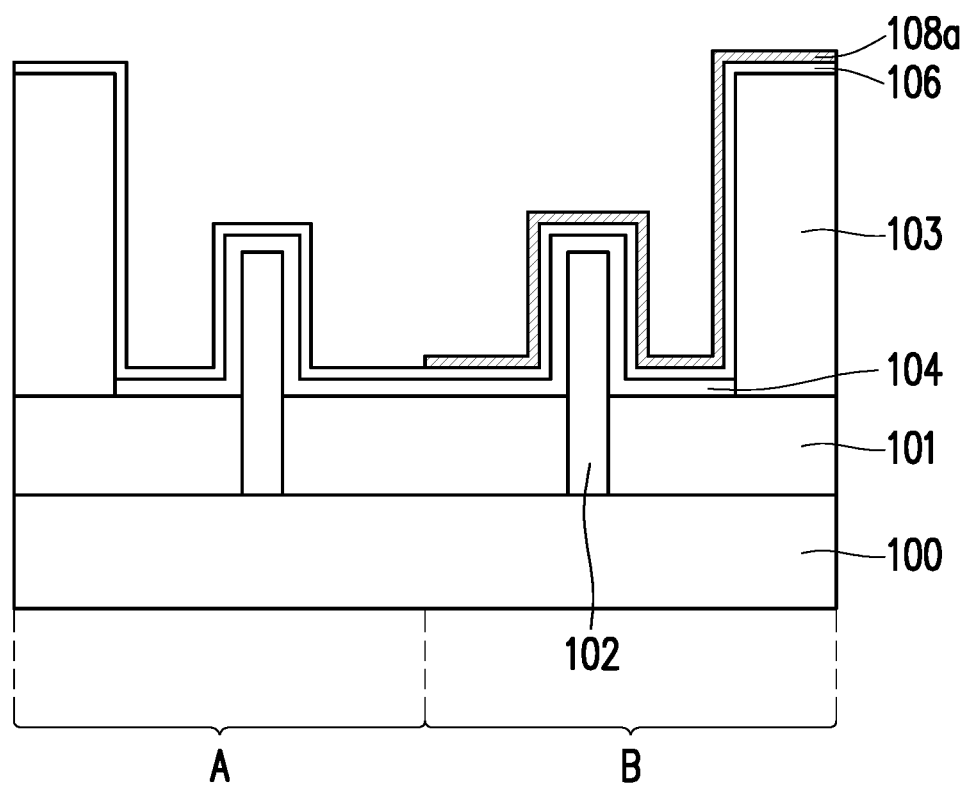

Referring to FIG. 12F, the patterned metal oxide layer 112a and the patterned bottom layer 110a are removed. The patterning process of the disclosure is thus completed.

In view of the above, a hydrophobic coating is applied on a part surface, so as to prevent water adsorption and film build-up on the part surface. With the deposition apparatus having hydrophobic parts, chamber particles are significantly reduced and the chamber maintenance performance such as mean wafers between clean (MWBC) is accordingly improved.

The concept of the deposition apparatus of the present disclosure may be applied to another deposition apparatus having part configuration differ from that of the process chamber 1 shown in FIG. 1. For example, the deposition apparatus of the present disclosure may be a chemical vapor deposition (CVD) apparatus.

In accordance with some embodiments of the present disclosure, a deposition apparatus includes a process chamber, a wafer platen and a shower head. The wafer platen is disposed in the process chamber. The shower head is located over the wafer platen and includes a shower plate and a hydrophobic film. The shower head has a plurality of dispensing holes for a reaction gas to pass through. The hydrophobic film is coated on a surface of the shower plate and surfaces of the plurality of dispensing holes.

In accordance with alternative embodiments of the present disclosure, a deposition apparatus includes a process chamber, a wafer platen and an exhaust unit. The wafer platen is disposed in the process chamber. The exhaust unit is configured to remove water from the process chamber and includes a vacuum pump, a pumping line, a throttle valve and a trap element. The pumping line is in fluid communication with the vacuum pump and the process chamber. The throttle valve is configured to control a gas flow rate in the pumping line. The trap element is configured to trap water from the process chamber.

In accordance with yet alternative embodiments of the present disclosure, a method of forming a metal oxide layer that includes the following operations. A substrate is provided in a process chamber of an atomic layer deposition apparatus, wherein the substrate has a target layer formed thereon. A first gas and a second gas are introduced into the process chamber through a shower head of the atomic layer deposition apparatus, so as to form an aluminum oxide film on the target layer, wherein the first gas includes water ($H_2O$), the second gas includes trimethyl aluminum (TMA), and the shower head is coated with a hydrophobic film. A patterned photoresist layer is formed on the aluminum oxide film. The aluminum oxide film is patterned by using the patterned photoresist layer as a mask, so as to form a patterned aluminum oxide film. The target layer is patterned by using the patterned aluminum oxide film as a mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A deposition apparatus, comprising:
    a process chamber;
    a wafer platen disposed in the process chamber;
    a shower head located over the wafer platen and comprising:
        a shower plate having a plurality of dispensing holes for a reaction gas to pass through; and
        a hydrophobic film coated on a top surface and a bottom surface of the shower plate and a sidewall surface of each of the plurality of dispensing holes; and
    a shielding element located under the shower head,
    wherein a flow control ring is disposed around and separated from the wafer platen, wherein a curve space with turning points is provided by the flow control ring and a heater cap on the wafer platen and the curve space faces a lower part of the process chamber, so as to control the reaction gas within an upper part of the process chamber but prevent the reaction gas from entering the lower part of the process chamber, and
    wherein a heater is embedded in the wafer platen, the heater cap is disposed over the wafer platen and located between the wafer platen and a wafer, wherein the heater cap completely covers the wafer platen and has a first overhang portion protruding from the wafer platen, the first overhang portion comprising a first protrusion portion having an inclined sidewall facing the lower part of the process chamber is located directly under the flow control ring, and another hydrophobic film is coated on a surface of the heater cap, wherein the shielding element has a second overhang portion, a bottom portion of the flow control ring is disposed on and in direct contact with the second overhang portion, the second overhang portion protrudes from the bottom portion of the shielding element and faces toward the inclined sidewall, a gap between the first overhang portion and the second overhang portion has a width gradually increased from the upper part of the process chamber toward the lower part of the process chamber; and a flowing path between the first overhang portion, flow control ring and the second overhang portion is in a C shape, wherein an upper horizontal surface of the first protrusion portion of the first overhang portion and the follow control ring form an upper portion of the C shape flowing path, and the inclined sidewall of the first protrusion portion and a second protrusion portion of the second overhang portion, facing the first protrusion portion, form a middle portion and a lower portion of the C shape following path.

2. The deposition apparatus of claim 1, wherein the hydrophobic film has a surface energy less than 70 mN/m.

3. The deposition apparatus of claim 1, wherein a portion of a top surface of the heater cap not covered by the wafer directly faces toward some of the plurality of dispensing holes.

4. The deposition apparatus of claim 1, wherein the hydrophobic film comprises polytetrafluoroethylene (PTFE), silicone, poly(vinylidene fluoride), polyethylene (PE), polypropylene (PP), polystyrene, poly(vinyl chloride) (PVC), nylon, poly(ethylene terephthalate) (PET), hydrophobic $SiO_2$, hydrophobic nickel or LaO.

5. The deposition apparatus of claim 1, wherein the hydrophobic film comprises hydrophobic particles.

6. The deposition apparatus of claim 1, wherein the hydrophobic film is provided with a rough surface or having a micro-nanostructure.

7. The deposition apparatus of claim 1, further comprising:
    a first gas line in fluid communication with a first gas source and the process chamber; and
    a second gas line in fluid communication with a second gas source and the process chamber,
    wherein the first gas source comprises water ($H_2O$), and the second gas source comprises trimethyl aluminum (TMA).

8. The deposition apparatus of claim 1, wherein the deposition apparatus is an atomic layer deposition apparatus for depositing a metal oxide layer on a substrate.

9. The deposition apparatus of claim 1, wherein a sidewall of the heater cap providing the curve space and a sidewall of the flow control ring providing the curve space directly face toward each other.

10. The deposition apparatus of claim 1, wherein the heater cap is an integral and one piece metal part.

11. The deposition apparatus of claim 1, wherein each of the dispensing holes has a stepped sidewall.

12. A deposition apparatus, comprising:
    a process chamber;
    a wafer platen disposed in the process chamber;
    a shower head located over the wafer platen and comprising:

a shower plate having a plurality of dispensing holes for a reaction gas to pass through; and a hydrophobic film coated on a surface of the shower plate and surfaces of the plurality of dispensing holes, wherein the hydrophobic film is provided with a rough surface;

an exhaust unit configured to remove water from the process chamber and comprising:

a vacuum pump;

a pumping line in fluid communication with the vacuum pump and the process chamber; and a throttle valve configured to control a gas flow rate in the pumping line; and a shielding element located under the shower head, wherein a flow control ring is disposed around and separated from the wafer platen, wherein a curve space with turning points is provided by the flow control ring and a heater cap on the wafer platen and the curve space faces a lower part of the process chamber, so as to control the reaction gas within an upper part of the process chamber but prevent the reaction gas from entering the lower part of the process chamber, and wherein a heater is embedded in the wafer platen, the heater cap is located between the wafer platen and a wafer, wherein the heater cap completely covers the wafer platen and has a first overhang portion protruding from the wafer platen, the first overhang portion comprising a first protrusion portion having an inclined sidewall facing the lower part of the process chamber is located directly under the flow control ring, and another hydrophobic film is coated on a surface of the heater cap, wherein the shielding element has a second overhang portion, a bottom portion of the flow control ring is disposed on and in direct contact with the second overhang portion, the second overhang portion protrudes from the bottom portion of the shielding element and faces toward the inclined sidewall, a gap between the first overhang portion and the second overhang portion has a width gradually increased from the upper part of the process chamber toward the lower part of the process chamber; and a flowing path between the first overhang portion, flow control ring and the second overhang portion is in a C shape, wherein an upper horizontal surface of the first protrusion portion of the first overhang portion and the follow control ring form an upper portion of the C shape flowing path, and the inclined sidewall of the first protrusion portion and a second protrusion portion of the second overhang portion, facing the first protrusion portion, form a middle portion and a lower portion of the C shape following path.

13. The deposition apparatus of claim 12, wherein the shower plate is provided with a rough surface or having a micro-nanostructure.

14. The deposition apparatus of claim 12, wherein the hydrophobic film comprises hydrophobic particle.

15. The deposition apparatus of claim 12, wherein a portion of a top surface of the heater cap not covered by the wafer directly faces toward some of the plurality of dispensing holes.

16. The deposition apparatus of claim 12, wherein a metal part of the deposition apparatus is coated with a hydrophobic film.

17. The deposition apparatus of claim 16, wherein the metal part comprises a ring, a pipe, a line, a manifold or a combination thereof.

18. The deposition apparatus of claim 12, wherein a sidewall of the heater cap providing the curve space and a sidewall of the flow control ring providing the curve space directly face toward each other.

19. The deposition apparatus of claim 12, wherein the dispensing holes at a center of the shower head have a shape or dimension different from the dispensing holes at an edge of the shower head.

20. A deposition apparatus, comprising:

a process chamber;

a wafer platen disposed in the process chamber;

a shower head located over the wafer platen and comprising:

a shower plate having a plurality of dispensing holes for a reaction gas to pass through; and a hydrophobic film coated on a surface of the shower plate and surfaces of the plurality of dispensing holes, wherein each of the dispensing holes has a straight upper hole and a cone lower hole; and a shielding element located under the shower head, wherein the deposition apparatus further comprises a gas channel plate disposed above the shower head, the gas channel plate has a dome-like shape with an inclined sidewall extending downwardly from a through-hole toward a sidewall of the process chamber, and wherein a flow control ring is disposed around and separated from the wafer platen, wherein a curve space with turning points is provided by the flow control ring and a heater cap on the wafer platen and the curve space faces a lower part of the process chamber, so as to control the reaction gas within an upper part of the process chamber but prevent the reaction gas from entering the lower part of the process chamber, and wherein a heater is embedded in the wafer platen, the heater cap is configured to support a wafer, wherein another hydrophobic film is coated on a surface of the heater cap, the heater cap completely covers the wafer platen and has a first overhang portion protruding from the wafer platen, the first overhang portion comprising a first protrusion portion is located directly under the flow control ring, and a lateral dimension of the first protrusion portion is continuously decreased along a direction from the upper part of the process chamber toward the lower part of the process chamber, and wherein a top surface of the flow control ring is flush with a top surface of the heater cap, and wherein the shielding element has a second overhang portion, a bottom portion of the flow control ring is disposed on and in direct contact with the second overhang portion, the second overhang portion protrudes from the bottom portion of the shielding element and faces toward the first protrusion portion having the lateral dimension, a gap between the first overhang portion and the second overhang portion has a width gradually increased along the direction, and a flowing path between the first overhang portion, flow control ring and the second overhang portion is in a C shape, wherein an upper horizontal surface of the first protrusion portion having the lateral dimension and the follow control ring form an upper portion of the C shape flowing path, and the first protrusion portion having the lateral dimension and a second protrusion portion of the second overhang portion, facing the first protrusion portion having the lateral dimension, form a middle portion and a lower portion of the C shape following path.

* * * * *